United States Patent [19]
Okamoto

[11] Patent Number: 5,289,404
[45] Date of Patent: Feb. 22, 1994

[54] SEMICONDUCTOR MEMORY DEVICE

[75] Inventor: Yutaka Okamoto, Tokyo, Japan

[73] Assignee: Sony Corporation, Tokyo, Japan

[21] Appl. No.: 74,706

[22] Filed: Jun. 9, 1993

Related U.S. Application Data

[63] Continuation of Ser. No. 821,574, Jan. 16, 1992, abandoned.

[30] Foreign Application Priority Data

Jan. 22, 1991 [JP] Japan .................................. 3-021645

[51] Int. Cl.$^5$ ................................................ G11C 5/06
[52] U.S. Cl. ........................................ 365/63; 365/52; 365/72; 257/69; 257/393; 257/758; 257/773
[58] Field of Search ............... 365/52, 63, 72; 257/69, 257/393, 758, 773

[56] References Cited

U.S. PATENT DOCUMENTS 4,034,243  7/1977  Love et al. .......................... 257/393

Primary Examiner—Joseph E. Clawson, Jr.
Attorney, Agent, or Firm—William S. Frommer; Alvin Sinderbrand

[57] ABSTRACT

A semiconductor memory device includes a plurality of memory cells arranged along a word line. Each memory cell is constituted by a flip-flop formed by a pair of driver transistors of a first conductivity channel and a pair of load transistors of a second conductivity channel. The load transistors have an active layer formed by a semiconductor thin film.

A power line connected to the load transistors includes a first metal layer that extends in a direction parallel to the word line and connections, arranged at intervals along the word line, between the first metal layer and the semiconductor thin film.

A ground line is connected to the driver transistors and includes a second metal layer that extends in a direction parallel to the word line and a connecting portion that is connected to the second metal layer and extends in a direction perpendicular to the word line.

This arrangement prevents the ON current of the load transistors from being reduced thereby increasing the ON/OFF current ratio without increasing the area required for the memory device. Accordingly, data retention characteristics can be improved without decreasing the degree of circuit integration.

5 Claims, 3 Drawing Sheets

SEMICONDUCTOR MEMORY DEVICE

This application is a continuation of application Ser. No. 07/821,574, filed Jan. 16, 1992, now abandoned.

BACKGROUND OF THE INVENTION

1. Field of the Invention

The present invention relates to a semiconductor memory device called an SRAM using a (thin film transistor) load.

2. Description of the Prior Art

An SRAM using a TFT load is obtained by substituting a PMOS-TFT for a resistor element in an SRAM that uses a resistor load. The SRAM using a TFT load has an advantage in that resistance to a soft error can be improved by obtaining a large ON current with a TFT.

FIG. 1 shows an SRAM using a TFT load, according to the prior art. In this prior art SRAM, an active layer of load PMOS transistors 12 of each of memory cells 11 is formed by a polysilicon layer 13. The polysilicon layer 13 continues on to the PMOS transistors 12 of each of the memory cells 11 and extends across blocks of a memory cell array.

At an end portion of the block of the memory cell array, the polysilicon layer 13 is connected to an Al layer 15 directly or through another polysilicon layer 14 doped with a p-type impurity at a high concentration or an impurity diffusion layer (not shown) of a semiconductor substrate. Therefore, in this prior art SRAM, the polysilicon layer 13 and the Al layer 15 serve as a power supply line. Note that one block of a memory cell array is constituted by, e.g., 128 cells.

A polycide layer 17 is connected to driver NMOS transistors 16 of each of the memory cells 11, and the polycide layer 17 is connected to Al layers 18 16 bits (i.e., 16 cells). Therefore, in this prior art SRAM, the polycide layer 17 and the Al layer 18 serve as a ground line.

The gate electrodes of transfer NMOS transistors 21 of each of the memory cells 11 serve as a word line 22, and a pair of noninverted and inverted bit lines 23 are connected to the NMOS transistors 21, respectively.

As is apparent from FIG. 1, the polysilicon layer 13 and the polycide layer 17 generally extend in a direction parallel to the word line 22, and the Al layers 15 and 18 and the bit lines 23 generally extend perpendicularly to the word line 22.

FIG. 2 shows another prior art SRAM using a TFT load. This prior art SRAM has the same arrangement as that of FIG. 1 except that Al layers 15 are not only arranged at the end portion of a memory cell array but connected to the polysilicon layer 13 at intervals of, for example 16 bits together with Al layers 18.

In the SRAM using a TFT load, the polysilicon layer 13 is formed by a thin film having a thickness of about 100 to 500 Å such that an OFF current of the PMOS transistor 12 serving as a TFT is decreased so that the ON/OFF current ratio is increased and the data retention characteristics of the memory cells 11 are improved.

In addition, the dose of a p-type impurity for forming the source/drain region of the polysilicon layer 13 is suppressed to be as low as $10^{14}$ cm$^{-2}$ such that lateral diffusion of the source/drain region of the PMOS transistor 12 is decreased to obtain a desired channel length.

For this reason, the sheet resistance of the polysilicon layer 13 is high, i.e., about 100 kΩ. Therefore, as in the prior art SCRAM B shown in FIG. 1, when the Al layer 15 is arranged only at the end portion of the memory cell array, the power supply line constituted by the polysilicon layer 13 and the Al layer 15 have a high resistance, and the ON current of the PMOS transistor 12 is decreased.

In contrast to this, as in the prior art SRAM shown in FIG. 2, since the Al layers 15 are arranged every 16 bits, the resistance of the power supply line is lower than that of the prior art SRAM of FIG. 1.

In the prior art, SRAM of FIG. 2, however, the area required for arranging the Al layers 15 is larger than that of the prior art SRAM of FIG. 1 and the degree of integration is decreased. Even when the Al layer 15 is to be formed by an Al layer which is an upper layer of the Al layer 18, since the Al layer has poor step coverage, the Al layer 15 must be temporarily connected to the polysilicon layer 13 through the same layer as the Al layer 18, and the degree of integration is inevitably decreased.

SUMMARY OF THE INVENTION

According to the invention, a semiconductor memory device includes a plurality of memory cells arranged along a word line. Each memory cell is constituted by a flip-flop formed by a pair of driver transistors of a first conductivity channel and a pair of load transistors of a second conductivity channel. The load transistors have an active layer formed by a semiconductor thin film. The device includes a power line connected to the load transistors and including a first metal layer that extends in a direction parallel to the word line, and means for connecting the first metal layer to the semiconductor thin film at intervals along the word line. The device also includes a ground line connected to the drive transistors and including a second metal layer that extends in a direction parallel to the word line and a connecting portion that is connected to the second metal layer and extends in a direction perpendicular to the word line.

With this arrangement, since the second metal layer runs parallel to the word line and forms part of the ground line, even when the connecting portions of the ground line are arranged with a low density, the total resistance of the second metal layer and the connecting portions is lower than is the case when the only portion of the ground line running parallel to the word line is formed of a material other than a metal.

Accordingly, even with an increased number of connection points between the semiconductor thin film and a portion of the power supply line extending in parallel to the word line, the density of the connecting portions of the ground line is arranged to be low, so that a larger area is not required for the semiconductor memory device.

As a result, the metal portion of the power supply line can be connected to the semiconductor thin film at points near the memory cells so that the total resistance of the power supply line can be decreased. Therefore, even when the thickness of the semiconductor thin film is reduced in order to reduce the OFF current of each load transistor, reduction in the ON current of the load transistor can be prevented in order to increase the ON/OFF current ratio.

In other words, in the semiconductor memory device according to the present invention, the decrease in ON current of each load transistor can be prevented in order to increase the ON/OFF current ratio without increasing the area required for the semiconductor memory device, thereby improving data retention characteristics without decreasing the degree of integration.

DETAILED DESCRIPTION OF THE PREFERRED EMBODIMENTS

Figure 1:
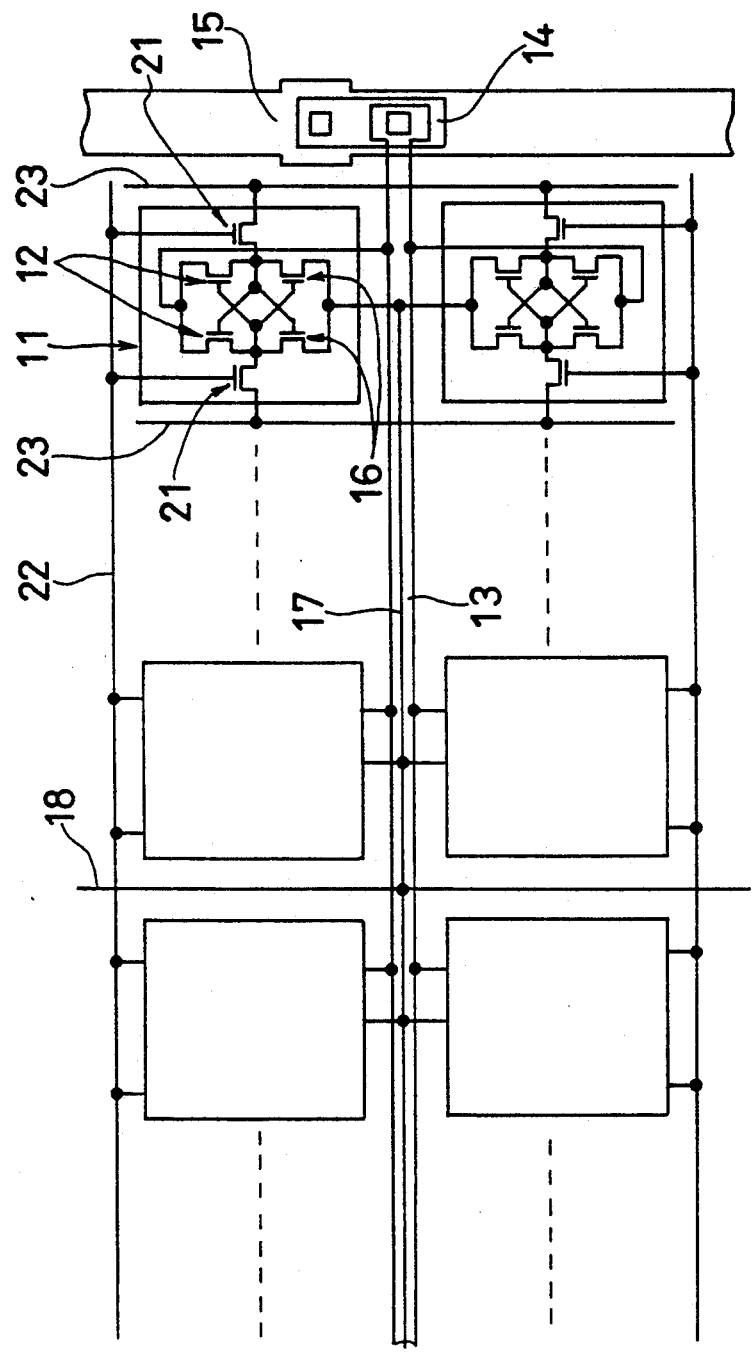
FIG. 1 is a plan view of a first prior art semiconductor memory device
Figure 2:
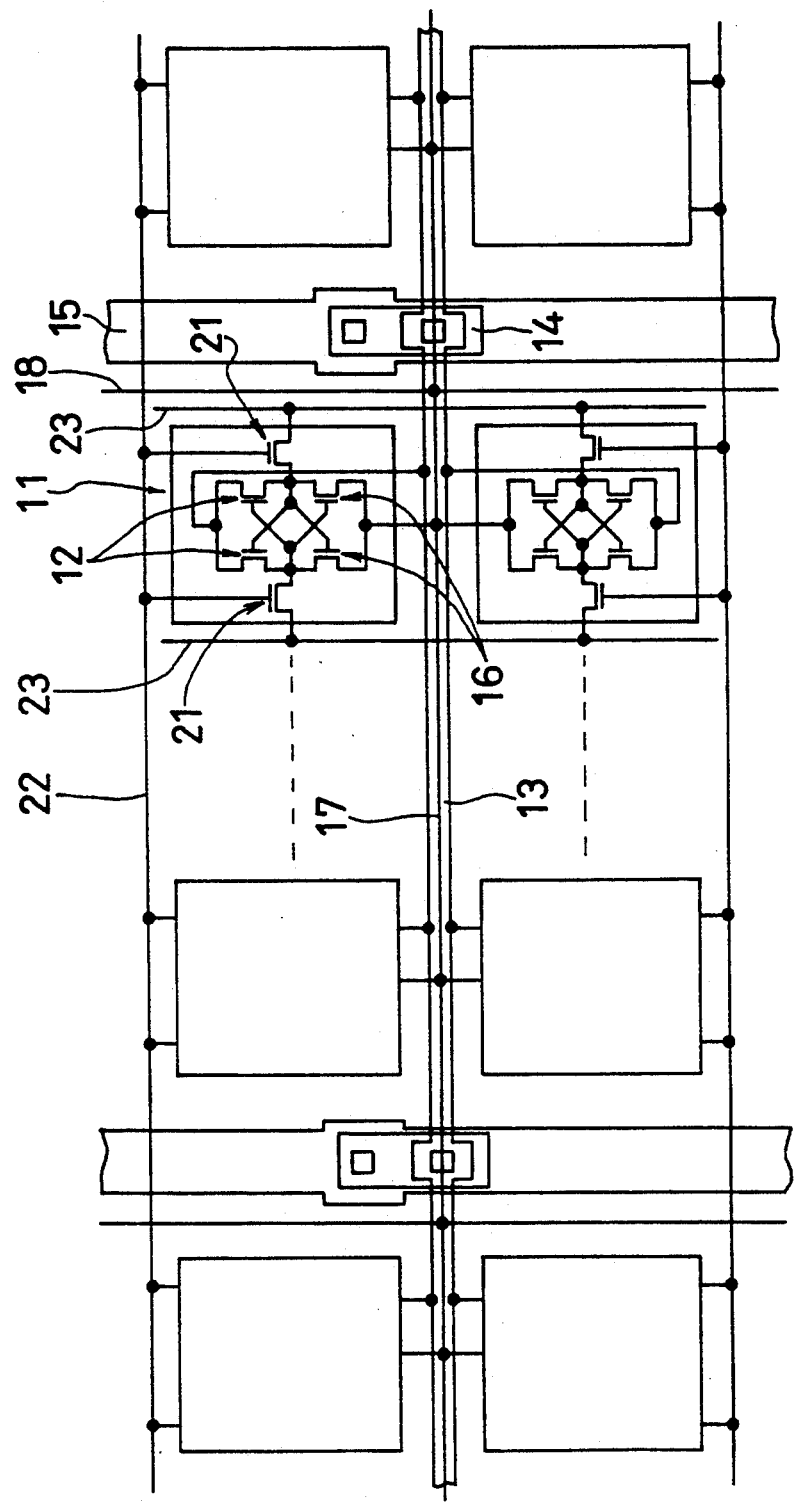
FIG. 2 is a plan view of a second prior art semiconductor memory device.

First and second embodiments of the present invention will be described below with reference to the accompanying drawings. The same reference numerals as in the prior art SRAMs shown in FIGS. 1 and 2 denote the same parts in FIG. 3, and a detailed description thereof will be omitted.

Figure 3:
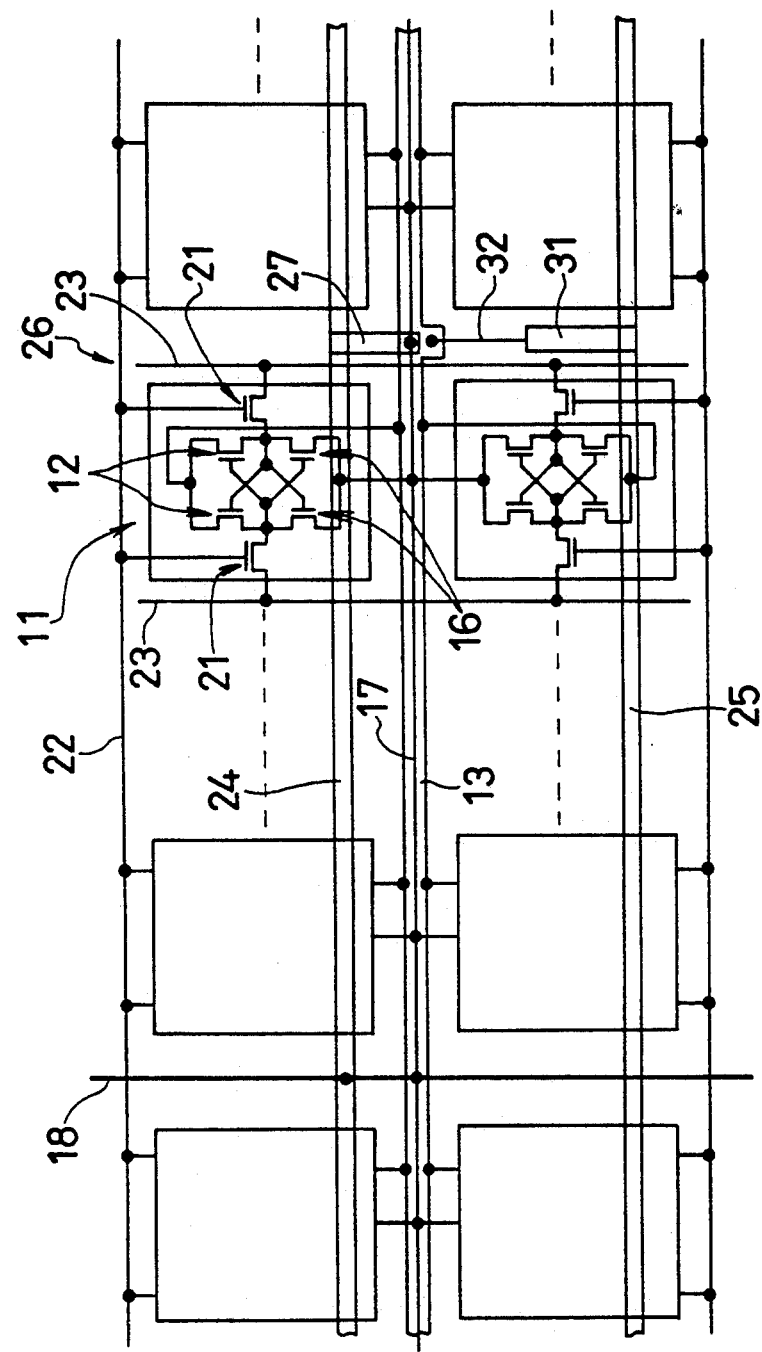
FIG. 3 is a plan view of a semiconductor memory device according to the present invention.

FIG. 3 shows the first embodiment of the present invention. According to the first embodiment, the Al layers 18 are obtained from a single Al layer and arranged at an interval twice that of the prior art, SRAMs, i.e., at intervals of 32 bits or memory cells.

According to the first embodiment, the semiconductor memory device has Al layers 24 and 25 patterned from a common Al layer separate from the layer that provides Al layer 18 and extending in a direction parallel to a word line 22.

The Al layer 24 is connected to the Al layer 18 at the cross point therebetween and to a polycide layer 17 in a region 26 through an Al layer 27 which is patterned from the same Al layer as the Al layers 18. Unlike the prior art SRAMs, the region 26 in the first embodiment does not have the Al layer 18.

Therefore, in the first embodiment, the polycide layer 17 and the Al layers 18 and 24 serve as a ground line. Although the density of the Al layers 18 is half that of the prior art SRAMS, the polycide layer 17 and the Al layer 24 are connected to each other at the same density as that of the Al layers 18.

For this reason, the connection density between the polycide layer 17 and the Al layer 18 or the Al layer 24 is the same as the connection density between the polycide layer 17 and the Al layer 18 in the prior art SRAMS. As a result, in the first embodiment, the same total resistance of the ground line as that of the prior art SRAMS can be obtained.

In the region 26, the Al layer 25 is connected to an Al layer 31 which is patterned from the same Al layer as the Al layer 27. The Al layer 31 is connected to a polysilicon layer 13 directly or through a polysilicon layer 32 doped with a p-type impurity at a high concentration or an impurity diffusion layer (not shown) of a semiconductor substrate. In addition, the Al layer 25 is connected to an Al layer 15 (FIG. 1) at the end portion of a block of a memory cell array. The Al layer 15 is patterned from the same Al layer as Al layers 18.

According to the first embodiment, the polysilicon layer 13 and the Al layers 15 and 25 serve as a power supply line. Since the polysilicon layer 13 and the Al layer 25 are connected to each other for example, at intervals of 32 bits, the total resistance of the power supply line is smaller than that of the prior art SRAM shown in FIG. 1.

The second embodiment will be described below. The second embodiment has the same arrangement as that of the first embodiment except that a polycide layer 17 and an Al layer 24 are not used and an Al layer which is patterned from the same Al layer as the Al layer 18 is used in place of the polycide layer 17.

According to the second embodiment, since all of the ground line is formed by the Al layer, the entire ground line has a resistance lower than that of the entire ground line of the first embodiment.

What is claimed is:

1. A semiconductor memory device having a plurality of memory cells arranged along a word line, each said memory cell being constituted by a flip-flop formed by a pair of driver transistors of a first conductivity channel and a pair of load transistors of a second conductivity channel, said load transistors having an active layer formed by a semiconductor thin film, the device comprising:

a ground line including a first line formed by a first metal layer and extending in a direction perpendicular to said word line, a second line formed by a second metal layer and connected to said first line at first connecting sections and extending in a direction parallel to said word line, a third line extending parallel to said word line and connected to an active layer of said driver transistors, and a fourth line formed by said first metal layer and interconnecting said second line and said third line at second connecting sections; and a power supply line including a fifth line formed by said second metal layer and extending in said direction parallel to said word line, a sixth line extending parallel to said word line and connected to said active layer of said load transistors, and a seventh line formed at least in part by said first metal layer and interconnecting said fifth line and said sixth line at third connecting sections.

2. A semiconductor memory device according to claim 1, wherein said first connecting sections are arranged along said second line at intervals of 32 of said memory cells.

3. A semiconductor memory device according to claim 1, wherein said second and third connecting sections are arranged respectively along said second and fifth lines and in locations in which said first connecting sections are not present.

4. A semiconductor memory device according to claim 1, wherein said second connecting sections are arranged along said second line at intervals of 32 of said memory cells.

5. A semiconductor memory device according to claim 1, wherein said sixth line is formed of a polysilicon layer.

* * * * *